US006798295B2

(12) United States Patent
Pengelly et al.

(10) Patent No.: US 6,798,295 B2
(45) Date of Patent: Sep. 28, 2004

(54) SINGLE PACKAGE MULTI-CHIP RF POWER AMPLIFIER

(75) Inventors: Raymond Sydney Pengelly, Hillsborough, NC (US); Simon Maurice Wood, Los Gatos, CA (US); John Phillip Quinn, Mountain View, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 27 days.

(21) Appl. No.: 10/318,849

(22) Filed: Dec. 13, 2002

(65) Prior Publication Data

US 2004/0113697 A1 Jun. 17, 2004

(51) Int. Cl.$^7$ .............................. H03F 3/68; H03F 3/191
(52) U.S. Cl. ....................... 330/295; 330/302; 330/307
(58) Field of Search ............................ 330/124 R, 295, 330/302, 307

(56) References Cited

U.S. PATENT DOCUMENTS 5,994,965 A * 11/1999 Davis et al. ................ 330/295
6,320,462 B1 * 11/2001 Alley ...................... 330/124 R

* cited by examiner

Primary Examiner—Steven J. Mottola
(74) Attorney, Agent, or Firm—Beyer Weaver & Thomas LLP

(57) ABSTRACT

Disclosed are a multi-chip power amplifier comprising a plurality of chips with each chip being a transistor amplifier, and a housing in which all of the semiconductor chips are mounted. A plurality of input leads extend into the housing and a plurality of output leads extend from the housing. A plurality of first matching networks couple a semiconductor chip to an input lead and a plurality of second matching networks couple each semiconductor chip to an output lead whereby each chip has its own input lead and output lead. By providing all amplifier chips within a single housing with matching networks within the housing coupling the chips to the input and output leads, manufacturing cost is reduced and the overall package footprint on a mounting substrate is reduced. Further, the close proximity of the chips within the housing reduces phase differences among signals in the semiconductor chips.

20 Claims, 3 Drawing Sheets

SINGLE PACKAGE MULTI-CHIP RF POWER AMPLIFIER

This application is related to application Ser. No. 10/059,866, filed Jan. 28, 2002, for N-WAY RF POWER AMPLIFIER WITH INCREASED BACKOFF POWER AND POWER ADDED EFFICIENCY, now U.S. Pat. No. 6,700,444, assigned to the present Assignee, and incorporated herein for all purposes.

BACKGROUND OF THE INVENTION

This invention relates generally to a multi-chip RF power amplifier, and more particularly the invention relates to packaging a multi-chip RF power amplifier.

Semiconductor power amplifiers typically comprise a plurality of semiconductor chips with each chip embodying a transistor amplifier, such as a silicon laterally diffused MOS field effect transistor (LDMOSFET). The transistor amplifiers can be operated in parallel to provide an increased power amplifier output, or the transistor amplifiers can comprise a main or carrier amplifier for maximum back-off power operation and a plurality of auxiliary or peak amplifiers which are suitably biased to begin operation sequentially for increasing power requirements. Such a power amplifier is described in copending application Ser. No. 10/059,866, supra.

Conventional practice is to individually package each transistor amplifier in a housing, and then connect the packaged transistor amplifiers through impedance matching networks and signal splitters to a common input. However, the use of individual chip packages increases manufacturing costs and increases the total package footprint on a supporting substrate. Further, the mounting of several packages necessarily increases transistor spacing and signal phase differences between the transistors.

BRIEF SUMMARY OF THE INVENTION

In accordance with the invention, a plurality of individual transistor amplifier chips are mounted within a single package with each chip having its own input and output leads. The chips can have unequal peripheries and gate widths, as often employed in a Doherty amplifier, and each chip can be pre-matched within the package for its input, output, and bias leads. The prematched transistor dice can then be used in high-efficiency amplifier designs, such as for carrier and peak amplifiers in a Doherty configuration.

The invention provides manufacturing efficiency and reduces the overall packaging footprint. Further, the transistor dice are in close proximity thereby minimizing phase differences in signals in the several transistors. For a Doherty application, the package must have twice the number of leads as there are chips in the package. This allows each transistor to be individually pre-matched within the package and individually biased.

The invention and objects and features thereof would be more readily apparent from the following detailed description and dependent claims when taken with the drawings.

DETAILED DESCRIPTION OF THE INVENTION

Figure 1:
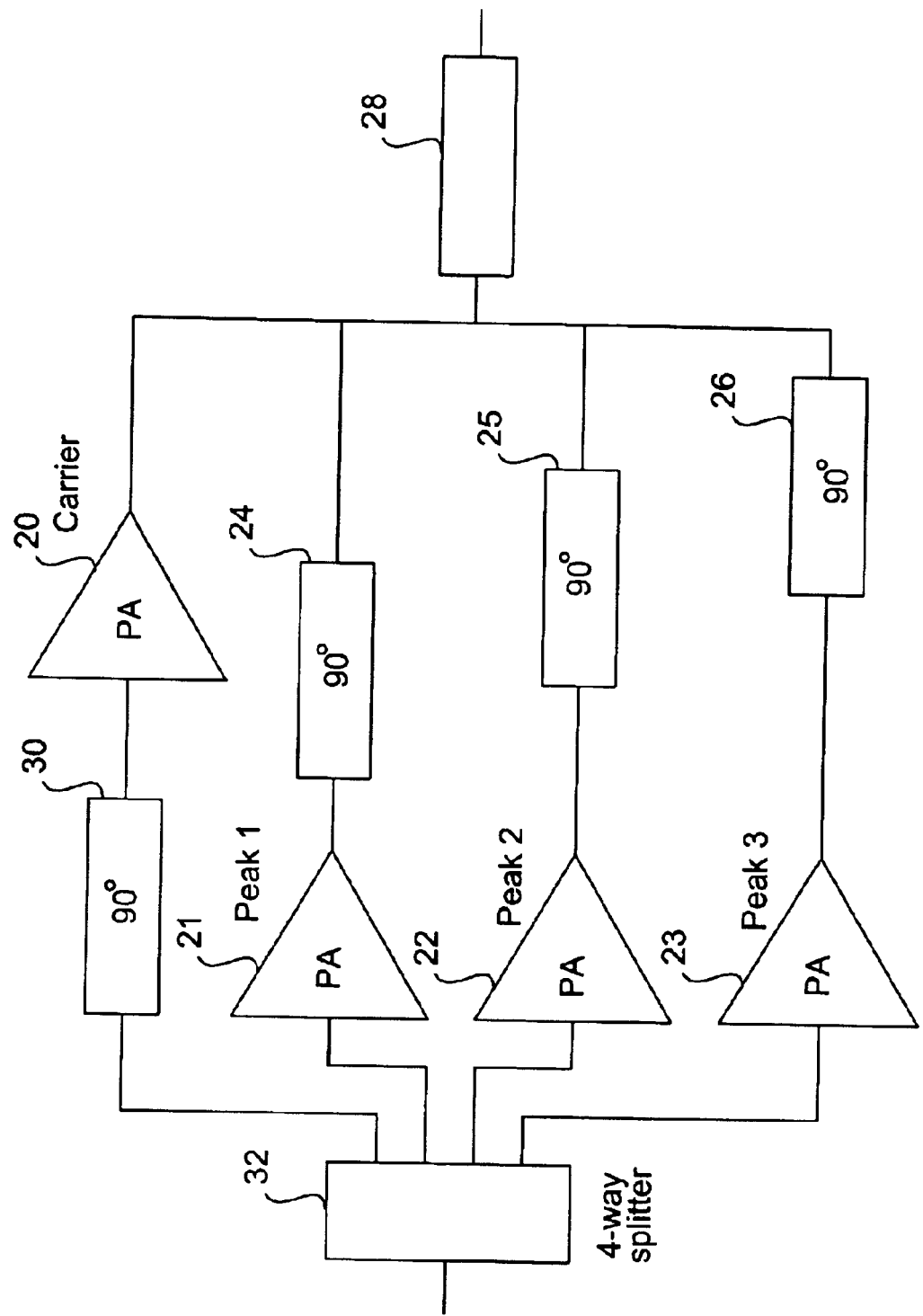
FIG. 1 is a functional block diagram of an RF power amplifier for amplifying an RF signal over a broad range of power and employing a plurality of individually packaged power amplifiers as disclosed in copending application Ser. No. 10/059,866.

FIG. 1 is a functional block diagram of a power amplifier described in copending application Ser. No. 10/059,866, supra, which employs a plurality of individually housed power amplifier chips including a carrier amplifier 20 and three peak amplifiers 21, 22, 23, with the peak amplifiers connected through 90° transformers 24, 25, 26, to an output load 28. A 90° transformer 30 connects a four-way splitter 32 to carrier amplifier 20. By setting the DC bias on each of the peak amplifiers to appropriate values, the peak amplifiers allow a Doherty action to be extended. For each peak amplifier that is added above the first, there will be a corresponding increase of 6 dB in the power range over which the peak efficiency will be maintained. The four-way amplifier extends the range of efficient power to a theoretical value of 18 dB. Such extension is very important in digital communication systems using modulation schemes where the peak to average power ratios can be as high as 13 dB. A 120 watt peak amplifier can be provided by a four-way Doherty arrangement with each path (carrier and three peak amplifiers) utilizing 30 watt transistors.

The individual power amplifiers need not be of the same size and the chips can have unequal peripheries or gate widths. However, each power amplifier must be impedance matched to the input and appropriately biased so that sequential operation of the amplifiers is realized for a broad range of power operation.

Figure 2:
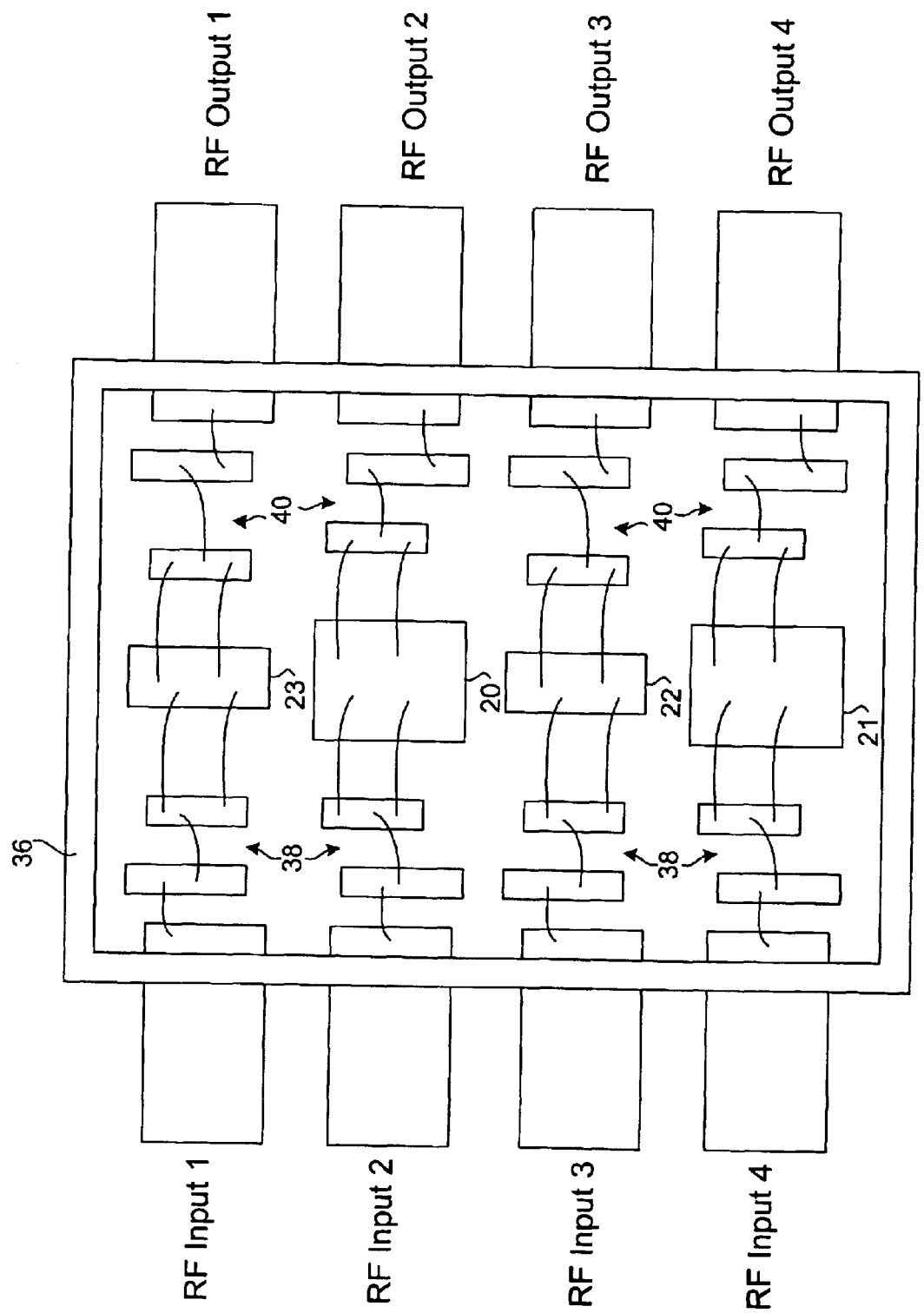
FIG. 2 is a plan view of an equivalent power amplifier to the amplifier of FIG. 1 in accordance with an embodiment of the invention.

FIG. 2 is a plan view of a package in accordance with the present invention in which the plurality of power amplifier chips 20–23 are mounted with housing 36. Each of the chips has its own input lead (RF input 1-RF input 4) and output lead (RF output 1-RF output 4). Further, each of the transistor chips 20–23 has its own impedance matching shown generally at 38 for the input, and shown generally at 40 for the output, and individually biased both for the gate and drain for a FET (base and collector for a bipolar device). Thus, for a Doherty arrangement the individual transistors can be matched differently and optimally as carrier and peaking amplifiers respectively.

Figure 3:
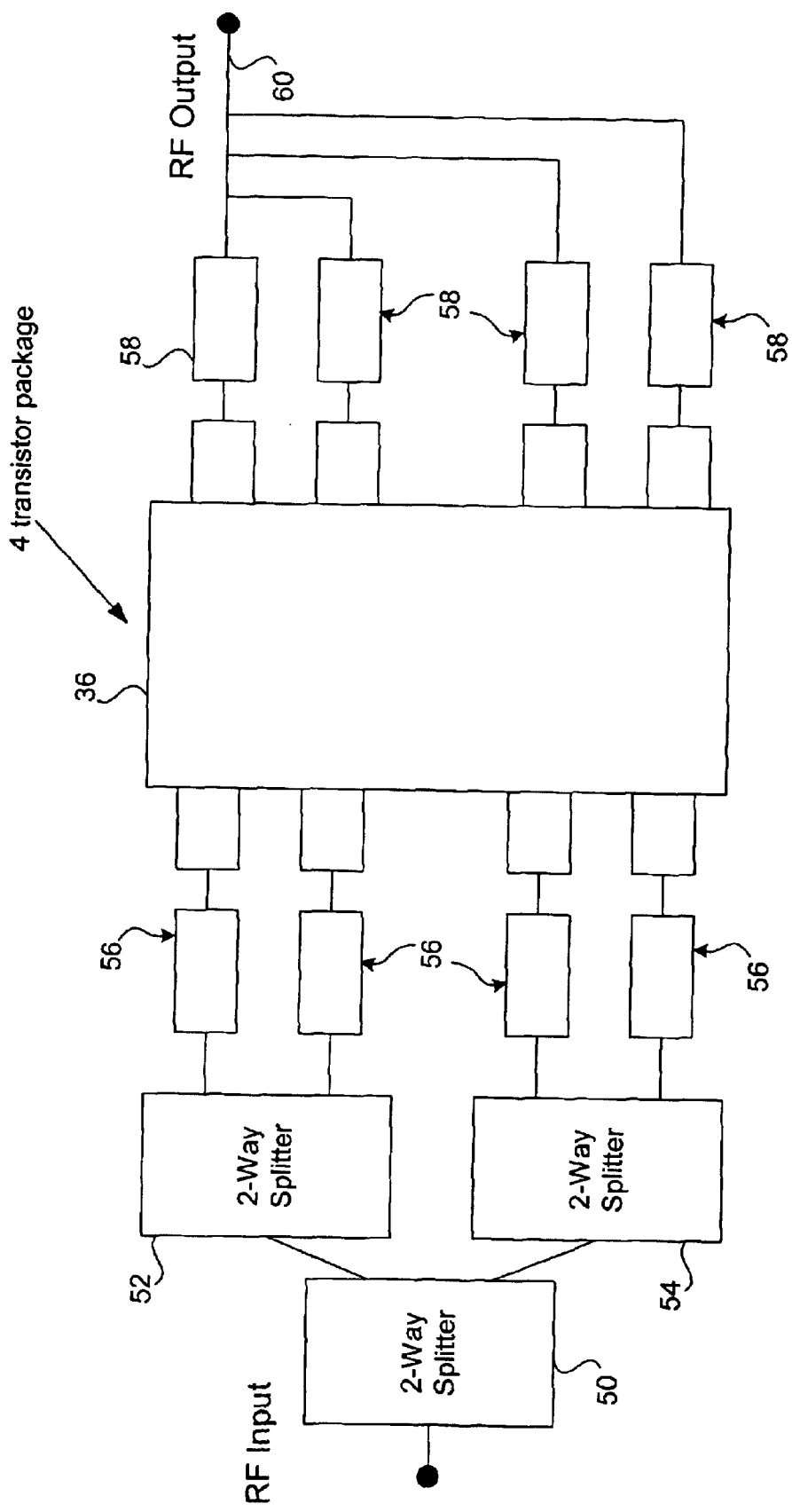
FIG. 3 is a functional block diagram of the power amplifier of FIG. 2 connected as a four-way Doherty amplifier.

FIG. 3 illustrates the four-transistor package 36 of FIG. 2 in a four-way Doherty amplifier. An RF input signal is applied through two-way splitters 50, 52, 54 to develop four input signals which are then applied through impedance matching circuitry 56 to the RF inputs of package 36. The outputs of the packaged amplifier 36 are applied through impedance matching circuitry shown generally at 58, and then summed as the RF output at 60.

The use of a single housing for a multi-transistor chip amplifier with individual leads provided in the housing for each amplifier chip not only lowers manufacturing costs, but the close proximity of the chips minimizes phase differences between the transistors. Additionally, the single housing reduces the amplifier footprint on a supporting substrate. While a four-chip Doherty amplifier has been described, the invention is readily applicable to a Doherty amplifier having a carrier amplifier and a single peak amplifier. Further, the invention is applicable to multistage amplifier transistors. The invention can be implemented using a wide range of semiconductor technologies including silicon bipolar, GaAs, MESFET, InGaHBT, SiC MESFET, and GaN HEMT, over a wide range of power levels and frequencies.

Thus, while the invention has been described with reference to specific embodiments, the description is illustrative of the invention is not to be construed as limiting the invention. Various modification and applications may occur to those skilled in the art without departing from the true spirit and scope of the invention as defined by the appended claims.

What is claimed is:

1. A multi-chip power amplifier comprising:
   a) a housing having a plurality of input leads and a plurality of output leads,
   b) a plurality of semiconductor chips mounted in the housing, each chip comprising a transistor amplifier,
   c) a plurality of first matching networks with each matching network being in the housing and coupling a semiconductor chip to an input lead, and
   d) a plurality of second matching networks with each network being in the housing and coupling a semiconductor chip to an output lead whereby each chip has its own input lead and output lead.

2. The multi-chip power amplifier as defined by claim 1 wherein each chip comprises a field effect transistor having source, drain, and gate elements, a first matching network coupling a gate element to an input lead and a second matching network coupling a drain element to an output lead.

3. The multi-chip power amplifier as defined by claim 2 wherein the field effect transistor is a silicon LDMOSFET.

4. The multi-chip power amplifier as defined by claim 2 wherein the field effect transistor comprises a MESFET.

5. The multi-chip power amplifier as defined by claim 1 wherein each chip comprises:
   a bipolar transistor having collector, base, and emitter elements, a first matching network coupling a base element to an input lead and a second matching network coupling a collector element to an output lead.

6. The multi-chip power amplifier as defined by claim 5 wherein the bipolar transistor comprises a silicon bipolar transistor.

7. The multi-chip power amplifier as defined by claim 5 wherein the bipolar transistor comprises a III–V heterojunction bipolar transistor.

8. The multi-chip power amplifier as defined by claim 5 wherein the bipolar transistor comprises a HEMT.

9. The multi-chip power amplifier as defined by claim 1 wherein the power amplifier is a Doherty amplifier wherein one chip provides a carrier amplifier and at least one chip provides a peak amplifier.

10. The multi-chip power amplifier as defined by claim 9 wherein a plurality of chips provide peak amplifiers with each peak amplifier being biased to sequentially activate in amplifying an input signal depending on input signal amplitude.

11. An amplifier circuit comprising:
    a) a signal splitter for splitting an input signal into N signals,
    b) a housing including N transistor amplifier chips mounted therein with N-input leads and N-output leads,
    c) input coupling means coupling the N signals to the N-input leads,
    d) input matching networks within the housing coupling each of the N-input leads to one of the N transistor amplifier chips, and
    e) N-output matching networks within the housing coupling each of the N-output leads to one of the N transistor amplifier chips.

12. The amplifier circuit as defined by claim 11 wherein each chip comprises a field effect transistor having source, drain, and gate elements, a first matching network coupling a gate element to an input lead and a second matching network coupling a drain element to an output lead.

13. The amplifier circuit as defined by claim 12 wherein the field effect transistor is a silicon LDMOSFET.

14. The amplifier circuit as defined by claim 12 wherein field effect transistor comprises a MESFET.

15. The amplifier circuit as defined by claim 11 wherein each chip comprises a bipolar transistor having collector, base, and emitter elements, a first matching network coupling a base element to an input lead and a second matching network coupling a collector element to an output lead.

16. The amplifier circuit as defined by claim 15 wherein the bipolar transistor comprises a silicon bipolar transistor.

17. The amplifier circuit as defined by claim 15 wherein the bipolar transistor comprises a III–V heterojunction bipolar transistor.

18. The amplifier circuit as defined by claim 15 wherein the bipolar transistor comprises a HEMT.

19. The amplifier circuit as defined by claim 11 wherein the power amplifier is a Doherty amplifier with one chip providing a carrier amplifier and at least one chip providing a peak amplifier.

20. The amplifier circuit as defined by claim 19 wherein a plurality of chips provide peak amplifiers with the peak amplifiers being biased to sequentially activate in amplifying an input signal depending on input signal amplitude.

* * * * *